United States Patent [19]

Lee

[11] Patent Number: 5,073,509
[45] Date of Patent: Dec. 17, 1991

[54] BLANKET CMOS CHANNEL-STOP IMPLANT

[75] Inventor: Ruojia R. Lee, Boise, Id.

[73] Assignee: Micron Technology, Inc., Boise, Id.

[21] Appl. No.: 450,445

[22] Filed: Dec. 11, 1989

[51] Int. Cl.$^5$ ............................................. H01L 21/335
[52] U.S. Cl. ................................... 437/34; 437/57
[58] Field of Search ................. 437/28, 29, 34, 57, 437/70, 27, 30

[56] References Cited

U.S. PATENT DOCUMENTS 4,554,726  11/1985  Hillenius et al. ........... 148/DIG. 70
4,839,301  6/1989  Lee ................................ 437/29

Primary Examiner—Olik Chaudhuri
Assistant Examiner—G. Fourson
Attorney, Agent, or Firm—Stanley N. Protigal

[57] ABSTRACT

A CMOS transistor is fabricated by forming the n-wells with both phosphorus and arsenic implants. The arsenic, with its lower diffusion coefficient, tends to concentrate near the top surface of the n-wells, with the phosphorus penetrating sufficiently to define the n-wells at the desired depth. A boron channel stop implant is later applied without masking over the n-wells. Since the arsenic implant is concentrated near the surface, the arsenic impurities overcome the effects of the boron impurities.

10 Claims, 4 Drawing Sheets

BLANKET CMOS CHANNEL-STOP IMPLANT

FIELD OF THE INVENTION

This invention relates to VLSI semiconductor CMOS processes, and more specifically to blanket channel-stop implants of dopant into p-well and n-well regions. The invention is particularly applicable to dynamic random access memory devices (DRAMS).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

In many transistor circuits, it is necessary to form both n-channel transistors and p-channel transistors, in a complimentary metal oxide semiconductor (CMOS) circuit.

In the fabrication of a CMOS circuit, an n-well is first formed by masking a semiconductor wafer and implanting an impurity. The impurity is intended to infiltrate to a sufficient depth to define the n-well, as an n- material of sufficient depth to permit the functioning of the p-channel transistor circuit.

A typical dopant used is phosphorus which has a characteristic of being fairly easy to control in depth and distribution.

After forming the n-wells, a thin layer of oxide, in the range of 250 A, is grown on the wafer to form an initial oxide layer. The nitride is deposited and the wafer is then masked again for the purpose of defining active areas (AA). The mask is stripped and a photomask is then applied over n-wells. A boron implant is applied to the p-type area, with the boron functioning as a channel-stop implant. The boron does not penetrate the nitride and, therefore, the nitrided areas do not receive the channel-stop implant. The photoresist is then stripped and fieldox (field oxide) is grown in areas which are not layered with nitride. The wafer is then masked again in order to shield the n-well, and a punch-through implant is applied to the n-type transistors, using boron dopant.

A blanket implant of some boron is applied through the field area prior to growth of field oxide, in order to raise n-channel field transistor threshold voltage $V_T$. P-channel field transistor $V_T$ may be degraded by this blanket boron implant, but will be improved by the use of arsenic in n-wells. N-channel field transistor $V_T$ is further increased by the use of boron high energy punch-through implant.

The choice of dopants is made in accordance with the electrical effects of the dopant and the ease at which the dopant is implanted. Since the ease of implant affects the distribution of the dopant, this, of course, also affects the electrical characteristics of the device. As mentioned, phosphorus is a fairly easy material to implant in that it requires a relatively low energy to penetrate the silicon wafer to a desired depth. Other dopants, such as arsenic, require more energy and tend to concentrate at a certain level; this level is determined by the amount of energy used in implanting the dopant.

Phosphorus is said to have a high diffusion coefficient, meaning that phosphorus is relatively easy to diffuse into the wafer. Arsenic, on the other hand, has a lower diffusion coefficient. Applying more energy to diffuse arsenic results in the arsenic concentrating at a different level, a phenomenon which is referred to (at least here in Idaho) as the snowplow effect.

In the prior art, n-channel transistors are provided with a channel-stop implant by first photomasking over the p-channel areas, and then applying the implant. The implant is a boron implant which creates a p+ material under areas which eventually will be defined as field areas by growing fieldox. The mask is used to prevent the boron from penetrating the transistor areas and thereby shorting the p-channel transistors.

U.S. Pat. No. 4,839,301, to inventor Lee, entitled *Blanket CMOS Channel Stop Implant Employing a Combination of n-Channel and p-Channel Punch-Through Implants* discloses a CMOS transistor fabricated by forming the n-wells with both phosphorus and arsenic implants. The arsenic, with its lower diffusion coefficient, tends to concentrate near the top surface of the n-wells, with the phosphorus penetrating sufficiently to define the n-wells at the desired depth. The use of arsenic had improved p-channel short-channel effects, and had compensated low-dose boron from blanket boron field implant This resulted in the savings of one mask.

A boron channel-stop implant was later applied without masking over the n-wells. Therefore, the boron implant for the n- and p-channels caused the boron to also be diffused into the n-wells. Since the arsenic implant is concentrated near the surface, the arsenic impurities overcame the effects of the boron impurities, thereby causing the top surface of the n-wells to remain as n- material.

The arsenic dopant was adjusted to that which would allow the n-well to remain as n- material and avoid the short-channel effect. It was also necessary to optimize the blanket boron field implant so that the degradation of p-channel field transistor $V_T$ will not be greater than the improvement made by the arsenic dopant punch-through. The high energy boron implant, on the other hand, was determined by the n-channel device requirements and by the additional n-channel field transistor $V_T$ improvement requirements.

Prior art techniques use blanket channel stop implant by only introducing arsenic in the n-well. One prior art technique avoids the use of a channel stop and $V_T$ adjustment photomask. Arsenic implant is introduced to the n-well in order to produce a high surface concentration and to serve as a channel-stop for p-channel devices. A second implant is a deep boron implant which is selectively placed into the p type material. The use of an implant mask is avoided because an oxide layer is placed over the n-wells as an oxide mask. That technique is disclosed in Chen, et al., *A High Performance Submicron CMOS Process With Self-Aligned Chan-Stop and Punch-Through Implants,* IEDM Vol. 86, pp 256-59.

The process of U.S. Pat. No. 4,839,301 avoided the requirement of the oxide mask, while still using a blanket channel-stop implant. The n-wells were formed with both phosphorus and arsenic implants. An n-channel punch-through implant was used to improve the n-channel field transistor characteristics. Without the n-channel punch-through implant, the n-channel field transistor characteristics was thought to be unacceptably degraded. Also, without the n-channel punch-through implant to improve the n-channel field transistor $V_T$, excessive blanket boron field implant dose was believed to be required. Since this would require more arsenic in the n-well to compensate for the boron, avoiding the punch-through implant was thought to inevitably degrade the p-channel transistor and speed.

From economical points of view, it is desirable to omit the number of mask steps used for fabricating integrated circuits. Therefore, any solution to the short channel effect should not result in substantially increasing masking; ideally it should result in a decrease in mask steps.

SUMMARY OF THE INVENTION

According to the present invention, a CMOS transistor is fabricated by forming the n-wells with both phosphorus and arsenic implants. The arsenic, with its lower diffusion coefficient, tends to concentrate near the top surface of the n-wells, with the phosphorus penetrating sufficiently to define the n-wells at the desired depth. The use of arsenic will: 1)improve p-channel short channel effects, and 2) compensate low-dose boron from blanket boron field implant and hence save one mask.

A boron channel-stop implant is later applied without masking over the n-wells. Therefore, the boron implant for the n- and p-channels causes the boron to also be diffused into the n-wells. Since the arsenic implant is concentrated near the surface, the arsenic impurities overcome the effects of the boron impurities, thereby causing the top surface of the n-wells to remain as n- material.

It is therefore necessary to adjust and to optimize the concentration of arsenic dopant to that which would allow the n-well to remain as n- material and avoid the short-channel effect. It is also necessary to optimize the blanket boron field implant so that the degradation of p-channel field transistor $V_T$ will not be greater than the improvement made by the arsenic dopant punch-through.

Prior art techniques use an n-channel punch-through implant to improve the n-channel field transistor characteristics. Without the n-channel punch-through implant, the n-channel field transistor characteristics were thought to be unacceptably degraded, and more blanket boron field implant dose would be required. This, in turn, requires more arsenic in the n-well to compensate for the boron. Too high arsenic will inevitably degrade p-channel transistor and speed.

DETAILED DESCRIPTION OF THE PREFERRED EMBODIMENT

In order to fabricate the CMOS transistor, a wafer 11 has an initial oxide layer 13 grown on a top surface. Wafer 11 is masked (not shown) and nitride 15 is deposited over unmasked areas which will define p-type areas.

Figure 1:
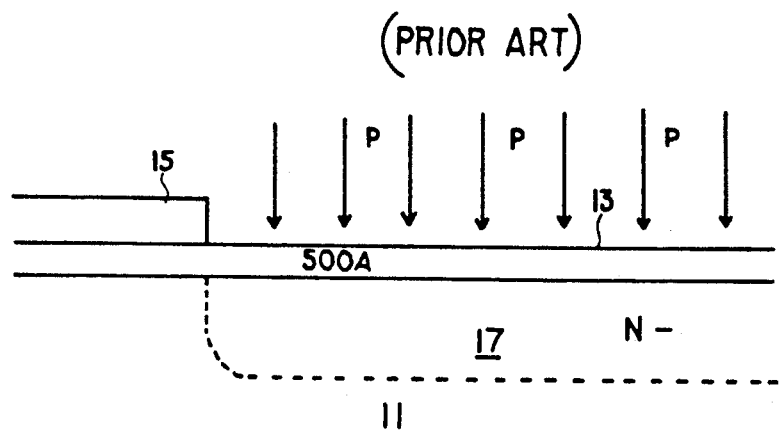
FIG. 1 (prior art) shows a cross-section of a wafer during the fabrication of a semiconductor circuit device, in which dopants are applied to form n-wells.

As shown in FIG. 1, the wafer 11 is then subjected to an n-well implant in order to define n-wells 17. The n-well implant is a dopant which is selected to diffuse to a depth which defines the n-well 17. In the prior art, phosphorus has been chosen as an implant material because of its favorable diffusion coefficient.

After the diffusion, the nitride 15 is removed from the p-type areas and nitride is applied to define field areas, as shown at 21.

Figure 2:
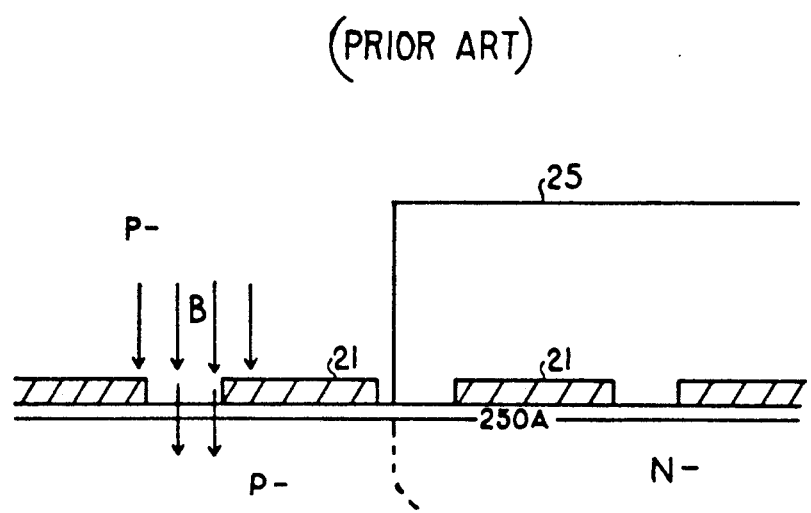
FIG. 2 (prior art) shows the masking and implantation of dopants into the p-type areas.

Referring to FIG. 2, the n-wells were masked by a mask 25 and a boron implant was applied to the p-type material in order to form a channel-stop implant in the un-nitrided areas, with the nitride 21 blocking with the boron from active areas. This is similar to the prior art process for doping the p-type material. The mask 25 prevents the boron from being implanted into the n-wells.

Figure 3:
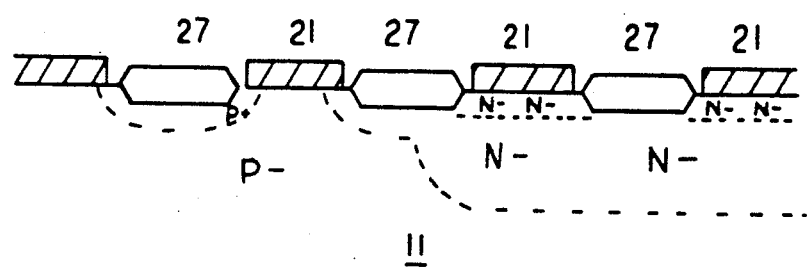
FIG. 3 shows the growth of fieldox after formation of the p-channel and n-channel areas.

After the implant, the mask 25 is stripped and oxide is grown on the field areas defined by the absence of nitride 21, forming fieldox (field oxide) 27, as shown in FIG. 3. As a result of prior implant of boron, p+ areas include two phases of p type material remaining under the fieldox 27. This increases parasitic field transistor threshold voltage $V_{TF}$.

Figure 4:
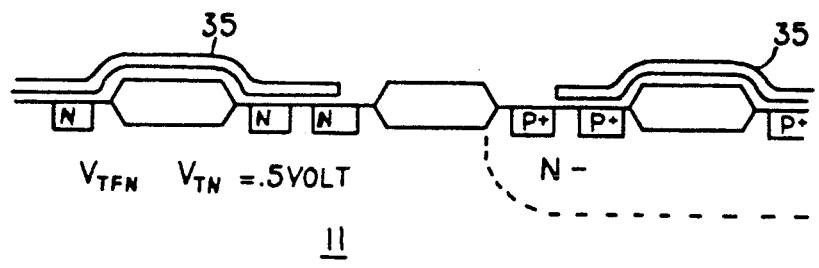
FIG. 4 shows formation of transistor gates after deposition of polysilicon for transistor gate formation and some interconnects.

Polysilicon (poly) 35 is then deposited, as shown in FIG. 4. The wafer is further processed in order to establish a desired circuit.

Figure 5:
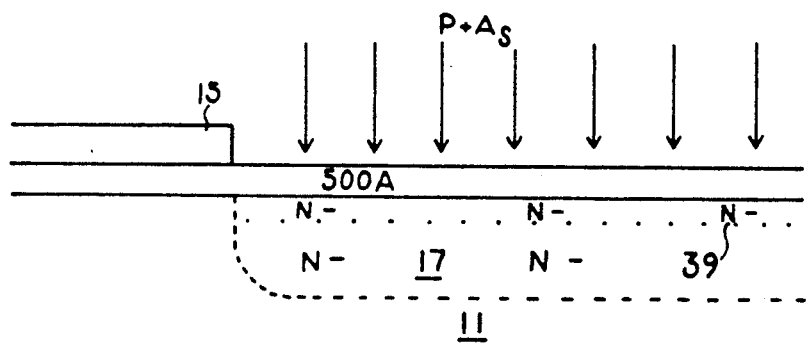
FIG. 5 shows a modification of the configuration of FIG. 1, in which multiple dopants are used to absorb the effects of the n-wells being exposed to p-channel dopants.

Referring to FIG. 5, it is possible to augment the initial n-well implant by using a dopant with a lower diffusion coefficient. This results in a top layer of the n-wells having a higher concentration of impurity forming n- material. This is indicated by dotted line 39. In the preferred embodiment, arsenic is used as the additional impurity, because it cooperates well with the phosphorus implant. This supplemental implant of arsenic further reduces any short channel effect of p-channel transistors.

Figure 6:
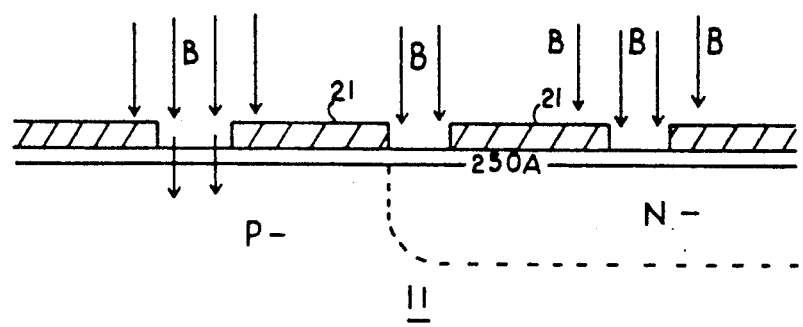
FIG. 6 shows the implementation of dopants for p-type areas in accordance with the present invention.

In addition, the supplemental implant permits the boron implant to be performed without masking the n-wells (mask 25 in FIG. 2). Therefore, as shown in FIG. 6, the boron impurities are permitted to penetrate the n-wells. Since the diffusion of arsenic has a shallow profile (dotted line 39), the boron implanted into the n-wells is counteracted by the arsenic and, therefore, has not damaged the n-well circuits.

In order to limit the effect of the boron, it is necessary to place limitations on the amount of boron which may be applied in this step. In this manner, the abilities of circuit techniques to improve p-well channel-stop isolation are used. By limiting the amount of boron, it is possible to eliminate the initial boron implant mask step.

This elimination of the initial mask step for boron implant means that, after active area is defined, we are able to apply a blanket implant in order to improve p area field isolation. This is followed by growth of oxide without an intervening mask step.

The elimination of the mask, when applying the blanket implant after active area is defined, may tend to degrade the transistors formed by this process. This problem is reduced by using a charge pump to reduce $V_{BB}$ to a slight negative potential. In test wafers, $V_{BB}$ was −0.5 v. Other circuit techniques can be used in order to further increase field isolations due to high body effect of field transistors.

What has been described is a very specific process in which transistors are formed from a single layer of polysilicon. It is, of course, possible to use the inventive techniques forming transistors with multiple layers of polysilicon, as the gate electrode layers.

It is also possible to use the inventive techniques in a variety of circuit devices which utilize n-wells and substrate junctions. Accordingly, the invention should be read as limited only by the claims.

I claim:

1. Method of fabricating transistor circuits having complimentary p-channel and n-channel transistors, in which n-wells are formed in a semiconductor wafer in areas at which p-type transistors are formed, the n-wells being defined by implanting the wafer with conductive impurities sufficiently to define the n-wells, and areas of the wafer outside of the n-wells being p areas, characterized by:
   a) applying a supplemental dopant implant material to the n-wells as n-type conductive impurity, the supplemental implant material having a diffusion coefficient which is less than that of the implant material used to define the n-wells;
   b) applying a p-type impurity to the wafer in a maskless implant step which is sufficient to result in p+ areas being formed outside of the n-wells, but insufficient to overcome the dopant effects within the n wells of the supplemental implant, thereby resulting in the n-wells remaining as n-type material, as a result of the supplemental implant;
   c) growing field oxide areas on the p areas.

2. Method of fabricating transistor circuits as described in claim 1, further characterized by:
   the choice of implant materials being made in accordance with the diffusion coefficient of the dopant to cause the distribution of the dopant to result in a relatively high concentration of minority carriers closer to a top surface and a lesser concentration of minority carriers to a desired depth further form the top surface.

3. Method of fabricating transistor circuits as described in claim 2, further characterized by:
   the material used to define the n-wells having a relatively high diffusion coefficient, as compared to the supplemental implant material, to the extent that the supplemental implant concentrates at a particular level within the n-wells.

4. Method of fabricating transistor circuits as described in claim 1, further characterized by:
   the material used to define the n-wells having a relatively high diffusion coefficient, as compared to the supplemental implant material, to the extent that the supplemental implant concentrates at a particular level within the n-wells.

5. Method of fabricating transistor circuits as described in claim 1, further characterized by:
   the implant material used to define the n-wells being phosphorus and the supplemental implant material being arsenic.

6. Method of fabricating a semiconductor random access memory array having complimentary p-channel and n-channel transistors, in which n-wells are formed in a semiconductor wafer in areas at which ptype transistors are formed, the n-wells being defined by implanting the wafer with impurities sufficiently to define the n-wells, and areas of the wafer outside of the n-wells being p areas, characterized by:
   a) applying a supplemental dopant implant material to the n-wells as an n-type conductive impurity, the supplemental implant material having a diffusion coefficient which is less than that of the implant material used to define the n-wells;
   b) applying a p-type impurity to the wafer in a maskless implant step which is sufficient to result in p+ areas being formed outside of the n-wells, but insufficient to overcome the dopant effects within the n wells of the supplemental implant, thereby resulting in the n-wells remaining as n-type material, as a result of the supplemental implant;
   c) growing field oxide areas on the p areas.

7. Method of fabricating semiconductor memory array as described in claim 6, further characterized by:
   the choice of implant materials being made in accordance with the diffusion coefficient of the dopant to cause the distribution of the dopant to result in a relatively high concentration of minority carriers closer to a top surface and a lesser concentration of minority carriers to a desired depth further form the top surface.

8. Method of fabricating semiconductor memory array as described in claim 7, further characterized by:
   the material used to define the n-wells having a relatively high diffusion coefficient, as compared to the supplemental implant material, to the extent that the supplemental implant concentrates at a particular level within the n-wells.

9. Method of fabricating semiconductor memory array as described in claim 6, further characterized by:
   the material used to define the n-wells having a relatively high diffusion coefficient, as compared to the supplemental implant material, to the extent that the supplemental implant concentrates at a particular level within the n-wells.

10. Method of fabricating a semiconductor memory array as described in claim 6, further characterized by:
    the implant material used to define the n-wells being phosphorus and the supplemental implant material being arsenic.

* * * * *